United States Patent
Ma et al.

(10) Patent No.: US 10,665,969 B1
(45) Date of Patent: May 26, 2020

(54) QUICK-MOUNTING HOUSING FOR ELECTRONIC DEVICE

(71) Applicant: NANNING FUGUI PRECISION INDUSTRIAL CO., LTD., Nanning (CN)

(72) Inventors: Jian Ma, Nanning (CN); Zhi-Gao Yang, Nanning (CN); Jin-Huan Song, Nanning (CN)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 0 days.

(21) Appl. No.: 16/525,892

(22) Filed: Jul. 30, 2019

(30) Foreign Application Priority Data

Nov. 5, 2018 (CN) .......................... 2018 1 1308743

(51) Int. Cl.
*H01R 9/26* (2006.01)
*H01R 4/40* (2006.01)

(52) U.S. Cl.
CPC ............. *H01R 9/2625* (2013.01); *H01R 4/40* (2013.01)

(58) Field of Classification Search
CPC .... H01R 9/2625; H01R 4/40; A63B 23/1218; B60R 7/00; B60R 9/00
USPC .......................................................... 439/76
See application file for complete search history.

(56) References Cited

U.S. PATENT DOCUMENTS

| 2,891,490 | A  | * | 6/1959  | Elsner ................... B60P 7/0815 |
|           |    |   |         | 410/105 |
| 6,749,161 | B1 | * | 6/2004  | Will ...................... A47F 5/0846 |
|           |    |   |         | 211/57.1 |
| 7,234,619 | B2 | * | 6/2007  | Hicks ...................... B60N 3/00 |
|           |    |   |         | 224/281 |
| 8,647,009 | B2 | * | 2/2014  | Kobayashi .............. F24S 25/61 |
|           |    |   |         | 403/7 |
| 8,907,215 | B2 | * | 12/2014 | Sakai ................... H02G 3/0691 |
|           |    |   |         | 174/489 |
| 9,671,060 | B1 | * | 6/2017  | Cifers ................ F16M 11/2085 |
| 9,999,802 | B2 | * | 6/2018  | Kilmon .................... A63B 7/00 |
| 10,435,117| B1 | * | 10/2019 | Cifers ................... B63B 25/002 |
| 10,544,895| B2 | * | 1/2020  | Chinn ................... B60P 7/0815 |

FOREIGN PATENT DOCUMENTS

CN          203176683 U     9/2013
TW          M303577 U       12/2006

* cited by examiner

*Primary Examiner* — Alexander Gilman
(74) *Attorney, Agent, or Firm* — ScienBiziP, P.C.

(57) ABSTRACT

A quickly-mountable housing of an electronic device includes the holding member and a main body. The main body includes a lateral panel having a first edge, a second edge, a first groove, a second groove, a hooking structure, and two blocks. The first groove extends along a traversal axis and the second groove extends along a longitudinal axis. The hooking structure extends toward the traversal axis from a lower side wall adjacent to the second edge. The two blocks on two sides of the longitudinal axis extend from side walls of the second groove toward the longitudinal axis. The holding member in the second groove is in a closed position where a holding part of the holding member is within the first groove.

18 Claims, 8 Drawing Sheets

QUICK-MOUNTING HOUSING FOR ELECTRONIC DEVICE

FIELD

The subject matter herein generally relates to mountings for electronic devices.

BACKGROUND

Electrical devices such as Gateways, Routers, Wireless APs, and PLC controllers are typically mounted to a wall or a fixture. Because the operator cannot directly observe the relationship between a rear side of the housing and the fixture during the installation process of a housing, the housing may not be quickly and accurately mounted on the fixture, which resulting in an increase in the installation time.

BRIEF DESCRIPTION OF THE DRAWINGS

Implementations of the present disclosure will now be described, by way of embodiments only, with reference to the attached figures.

DETAILED DESCRIPTION

Figure 1:
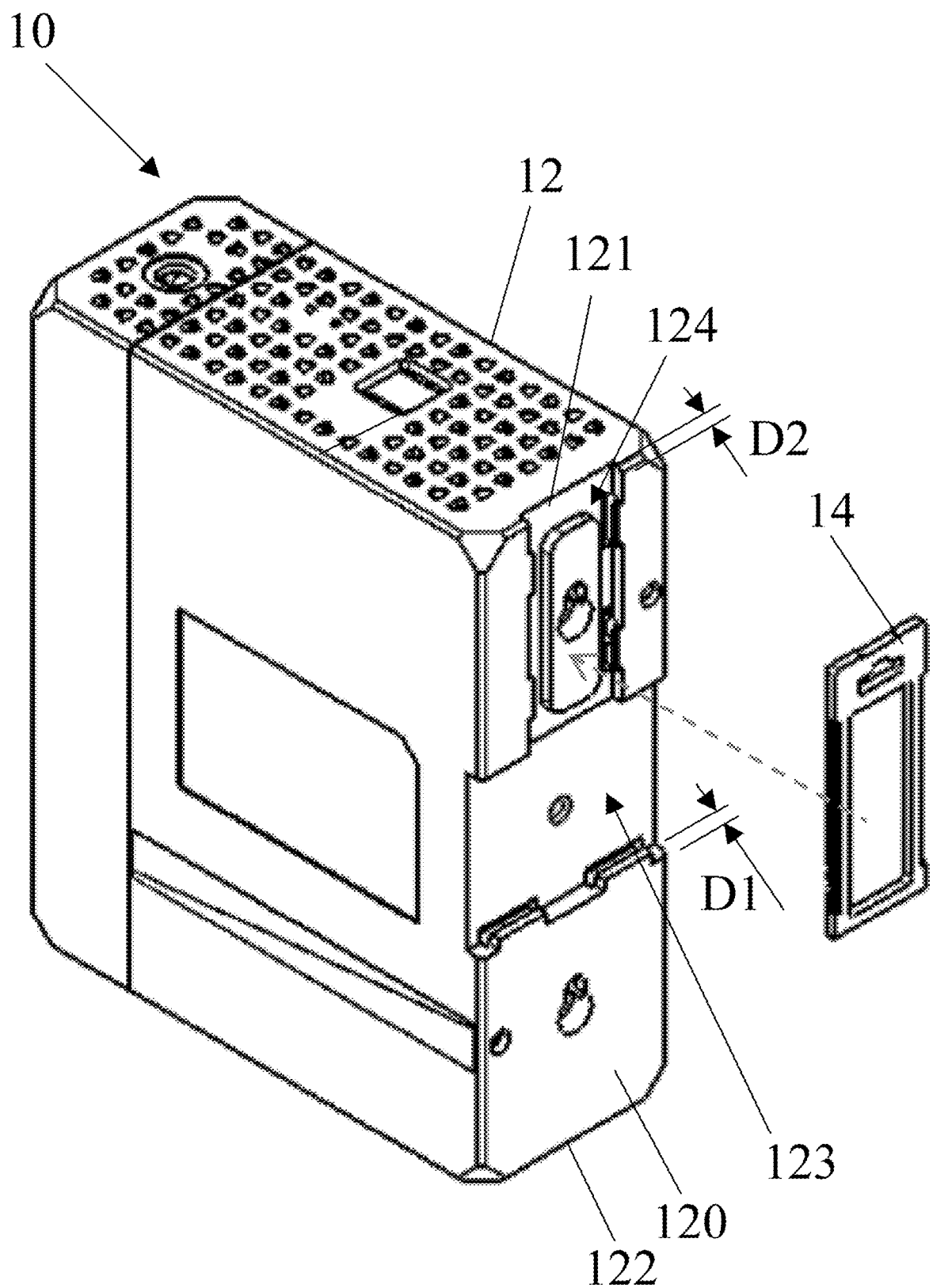
FIG. 1 shows a schematic view of a housing, in accordance with one embodiment.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and devices have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening devices, and is not necessarily limited to physical connections. The connection can be such that the objects are permanently connected or releasably connected. The term "substantially" is defined to be essentially conforming to the particular dimension, shape, or other feature that the term modifies, such that the device need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

Referring to FIG. 1, the disclosure provides a housing 10 which can be fixed on a wall by screws or be directly hung on a rod of an electronic device. The housing 10 is configured to receive at least one electronic element (such as mother board, display card, etc.). In one embodiment, the housing 10 includes a main body 12 and a holding member 14. The holding member 14 is positioned on the main body 12 and can be moved between a closed position and an open position (illustrated in detail in the embodiments relating to FIGS. 5-7), so as to connect the main body 12 to the rod.

Figure 2:
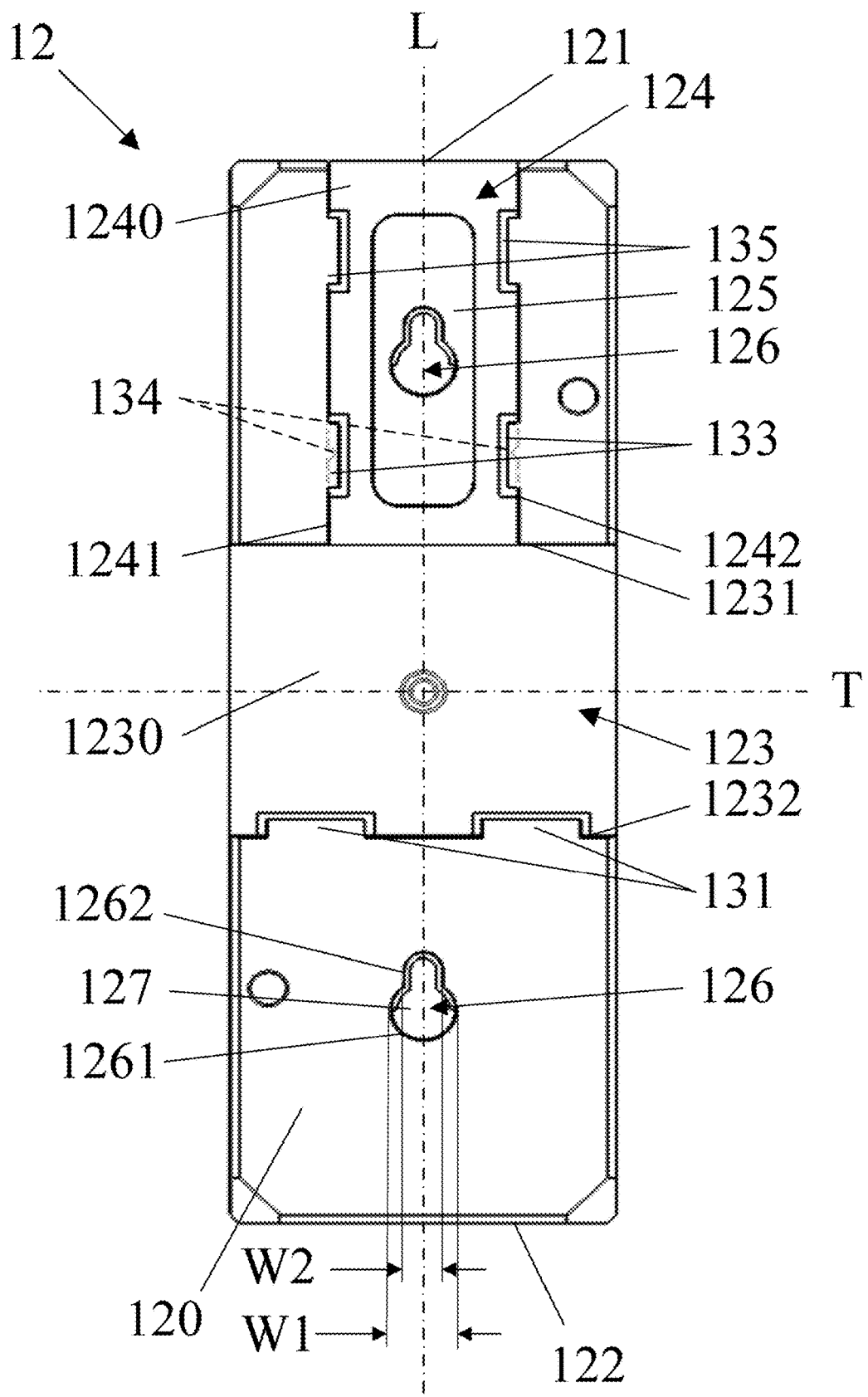
FIG. 2 shows a front view of a main body of a housing, in accordance with one embodiment.

Referring to FIGS. 1 and 2, in one embodiment, the main body 12 includes a lateral panel 120. The lateral panel 120 has a first edge 121 and a second edge 122 opposite to the first edge 121. A traversal line T passes through a central portion of the lateral panel 120, and a longitudinal axis L passes through the first edge 121, the traversal line T, and the second edge 122.

In one embodiment, the lateral panel 120 further includes a first groove 123, a second groove 124, a stage 125, at least one hooking structure 131, a number of blocks (such as two blocks 133 and two blocks 135), and two retention structures 134. The first groove 123 extends along a traversal line T and has a first depth D1 (see FIG. 1). In one embodiment, the first groove 123 connects a right edge of the lateral panel 120 to a left edge of the lateral panel 120 and extends parallel to the traversal line T. However, it should be appreciated that many variations and modifications can be made to embodiments of the disclosure. In cases where the rod on which the housing 10 is going to be mounted has a width, in a direction that is parallel to the traversal line T, that is less than a width of the main body 12, two ends of the first groove 123 are spaced apart from the right edge and the left edge of the lateral panel 120 by a distance and are not connected to the right edge and the left edge of the lateral panel 120.

The second groove 124 is connected to an upper side wall 1231 of the first groove 123 and extends along the longitudinal axis L. The upper side wall 1231 is located closer than the lower side wall 1232 of the first groove 123 is to the first edge 121. The second groove 124 has a second depth D2 (FIG. 1). In one embodiment, the first depth D1 is greater than the second depth D2. In one embodiment, in a direction that is parallel to the longitudinal axis L, two ends of the second groove 124 are connected to the upper side wall 1231 of the first groove 123 and the first edge 121. However, it should be appreciated that many variations and modifications can be made to embodiments of the disclosure. In another embodiment, the second groove 124 is spaced apart from the first edge 121 and is not connected to the first edge 121.

The hooking structure 131 protrudes from the lower side wall 1232 of the first groove 123 toward the traversal line T. In one embodiment, the lateral panel 120 includes two hooking structures 131. The two hooking structures 131 are located at two sides of the longitudinal axis L and extend from the lower side wall 1232 of the first groove 123. The two hooking structures 131 are spaced apart from a bottom surface 1230 of the first groove 123 by a distance approximately equal to a thickness of a rim of the rod for facilitating the connecting of the lateral panel 120 to the rod.

It should be appreciated that the number of the hooking structures 131 should not be limited to the above embodiment. In another embodiment, the lateral panel 120 merely includes one hooking structure 131 arranged on the longitudinal axis L. In yet another embodiment, the lateral panel 120 includes three or more than three hooking structures 131, the hooking structures 131 are arranged on the lower side wall 1232 of the first groove 123 and spaced apart from each other by the same distance.

The blocks 133 and 135 are configured to fix the holding member 14 in the second groove 124. In one embodiment, the two blocks 133 are located at two sides of the longitudinal axis L, and extends from opposite sides walls 1241 and 1242 of the second groove 124 toward the longitudinal axis L. In addition, the two blocks 135 are located at two sides of the longitudinal axis L, and extends from opposite sides walls 1241 and 1242 of the second groove 124 toward the longitudinal axis L. The blocks 133 and 135 positioned on the same side wall are spaced apart from each other, the block 135 is located closer than the block 133 is to the first edge 121. Each of the blocks 133 and 135 is spaced from a bottom surface 1240 of the second groove 124 by a certain distance. The certain distance may be slightly greater than a thickness of a flange of the holding member 14 (FIG. 1) that is going to be mounted in the second groove 124, for facilitating a connecting of the lateral panel 120 and the holding member 14. In another embodiment, the two blocks 135 are omitted, and the holding member 14 is fixed on the second groove 124 via the blocks 133.

Figure 3:
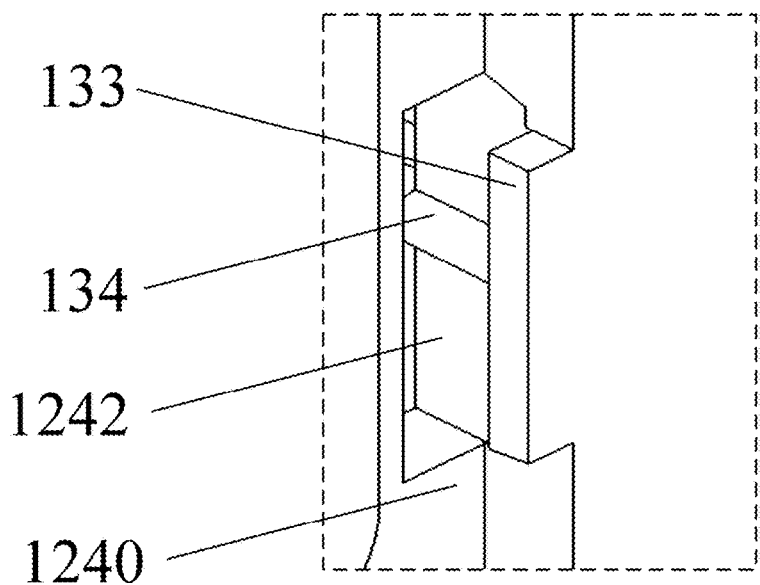
FIG. 3 shows a magnifying view of a portion of a main body, in accordance with one embodiment.

The two retention structures 134 are configured to limit a position of the holding member 14 in the second groove 124. In one embodiment, as shown in FIG. 3, the two retention structures 134 project from two side walls 1241 and 1242 of the second groove 124 and are connected to bottom sides of the two blocks 133. The cross section of the retention structure 134 may have a semi-circular shape, a tapered shape, or any other shape.

However, it should be appreciated that many variations and modifications can be made to embodiments of the disclosure. In another embodiment, each of the two retention structures 134 is located anywhere on the side walls 1241 and 1242, and the two retention structures 134 are misaligned with each other in a direction that is parallel to the traversal line T. In yet another embodiment, the two retention structures 134 are omitted, and the movement of the holding member 14 along the longitudinal axis L is limited merely by a clamping force generated by the blocks 133 and the bottom surface 1240 of the second groove 124. In yet another embodiment, one of the two retention structures 134 is omitted, and the position of the holding member 14 in the second groove 124 is limited by merely one retention structure 134.

Referring to FIG. 2, a stage 125 is located within the second groove 124. The stage 125 has a rectangular shape and is distant from the blocks 133 and 135. The holding member 14 may be inserted into the second groove 124 via a passage defined between the stage 125 and the block 133 and a passage defined between the stage 125 and the block 135. A top surface of the stage 125 is flush with a neighboring surface of the lateral panel 120.

Two fastening holes 126 are formed on the lateral panel 120. The two fastening holes 126 are located on two sides of the traversal line T and arranged on the longitudinal axis L. Specifically, one of the two fastening holes 126 is formed on the stage 125 and located between the first groove 123 and the first edge 121, and the other fastening hole 126 is located between the first groove 123 and the second edge 122. Since the top surface of the stage 125 is flush with the neighboring surface of the lateral panel 120, the two fastening holes 126 are located on the same plane. However, it should be appreciated that many variations and modifications can be made to embodiments of the disclosure. In the cases where the main body 12 is not to be hung on a wall by fastening members, the fastening holes 126 are omitted.

In one embodiment, the fastening hole 126 has a shape of a keyhole slot to improve the mounting stability on the wall. Specifically, as shown in FIG. 2, the edge of the fastening hole 126 has a first segment 1261 and a second segment 1262. Two ends of the first segment 1261 are connected to two ends of the second segment 162. The first segment 1261 is a portion of a circle and has a width W1 that is greater than a width of a screw head that is going to be inserted into the fastening hole 126. The second segment 1262 has two straight sub-segments connected to two ends of the first segment 1261 and a curved sub-segment connected between the two straight sub-segments. A width W2 between the two straight sub-segments is less than the width of the screw head that is going to be inserted into the fastening hole 126. In addition, the lateral panel 120 further includes a disk structure 127 positioned corresponding to the fastening hole 126. The disk structure 127 is connected to a portion of the first segment 1261 and is separated from the remaining edge of the fastening hole 126. The disk structure 127 is spaced apart from the front surface of the lateral panel 120 by a distance which is approximately equal to a thickness of the screw head that is going to be inserted into the fastening hole 126.

Figure 4:
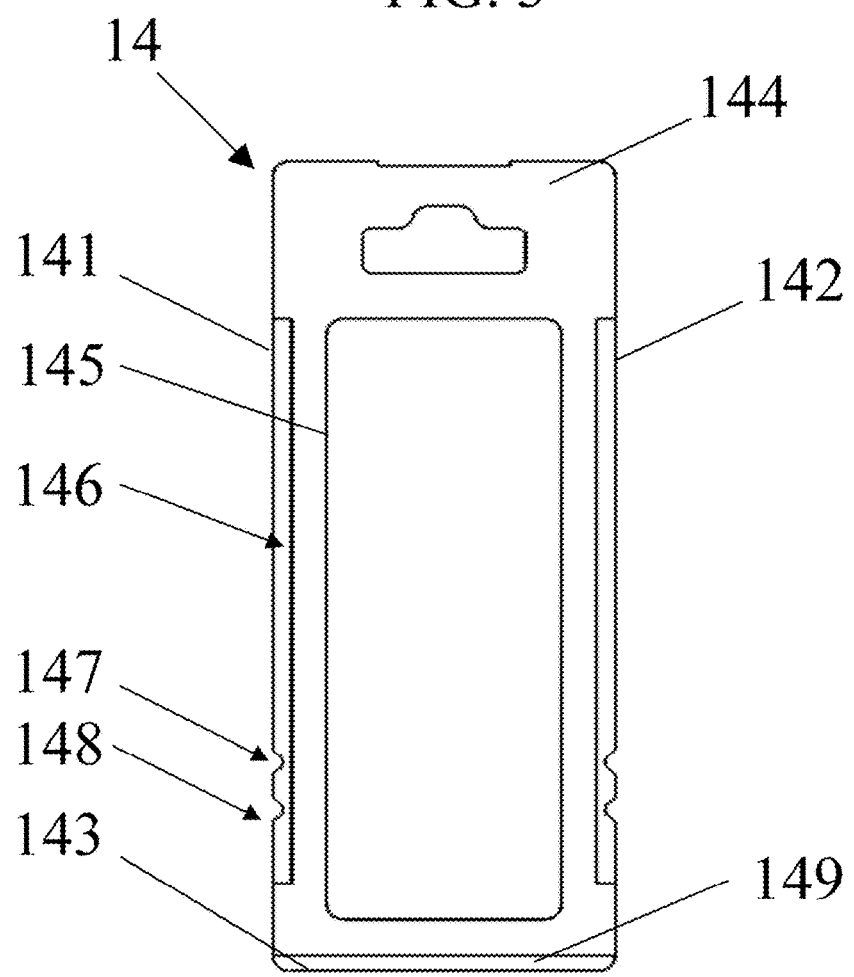
FIG. 4 shows a schematic view of a holding member, in accordance with one embodiment.

FIG. 4 shows a front view of the holding member 14, in accordance with one embodiment of the disclosure. In one embodiment, the holding member 14 has shape of a hollow rectangle with a side edge 141, a lower edge 143, a side edge 142, and an upper edge 144. The side edges 141 and 142 of the holding member 14 are located on two sides of the longitudinal axis L and positioned opposite to each other. The lower edge 143 and the upper edge 144 connect the side edge 141 to the side edge 142 and are positioned opposite to each other. Two sliding grooves 146 in strip form are formed immediately adjacent to the side edges 141 and 142 for receiving the blocks 133 and 135. A width of each sliding groove 146 is substantially equal to a width of the blocks 133 and 135. In addition, each of the side edges 141 and 142 includes a first recess 147 and a second recess 148. The first recess 147 and the second recess 148 are spaced apart from each other, and the second recess 148 is closer than the first recess 147 is to the lower edge 143. The holding member 14 further includes a holding part 149. The holding part 149 is positioned immediately adjacent to the lower edge 143. The holding part 149 has a thickness which is decreasing in a direction toward the lower edge 143.

Figure 5:
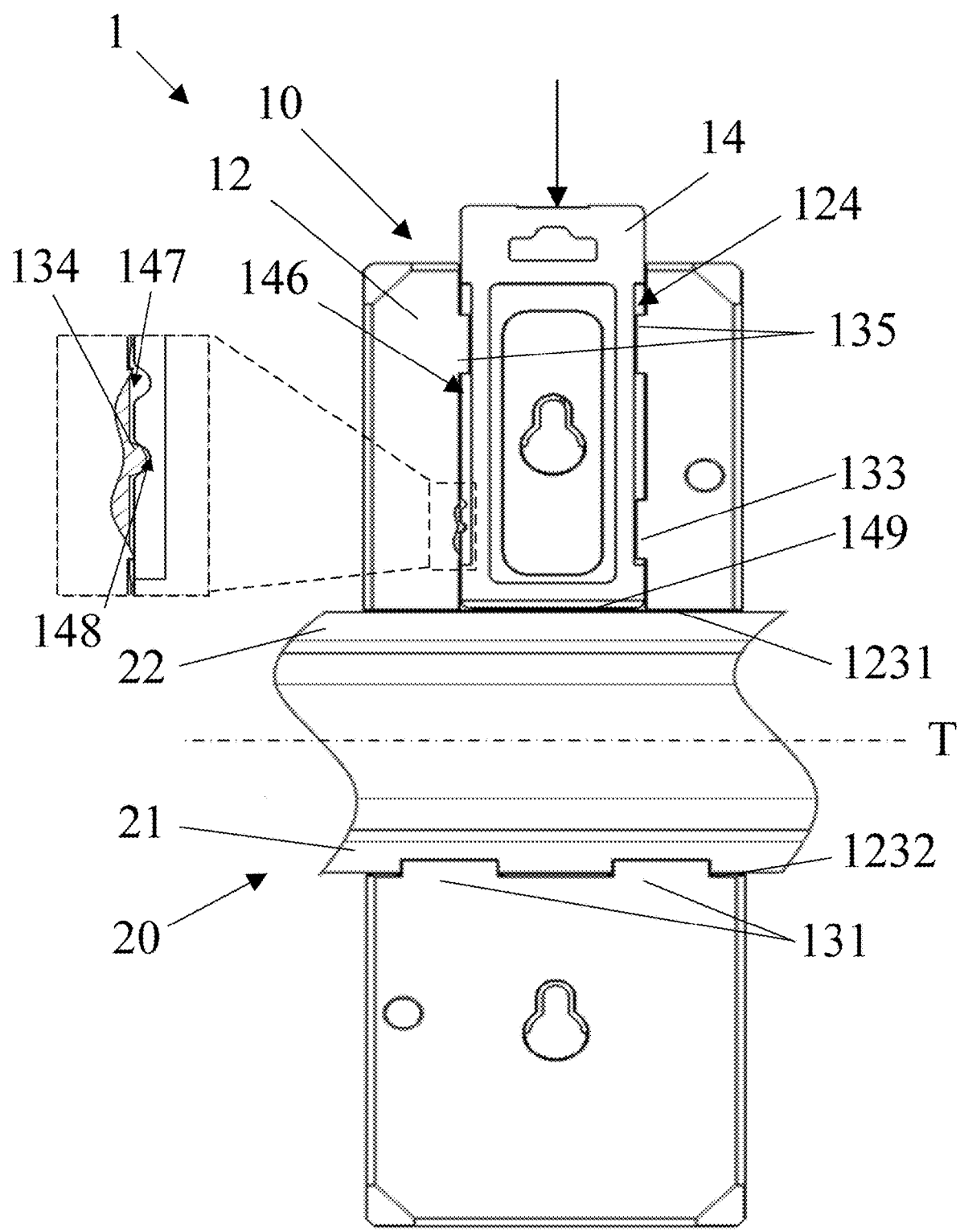
FIG. 5 shows a housing connecting with a rod as a holding member is positioned at an open position, in accordance with one embodiment.
Figure 6:
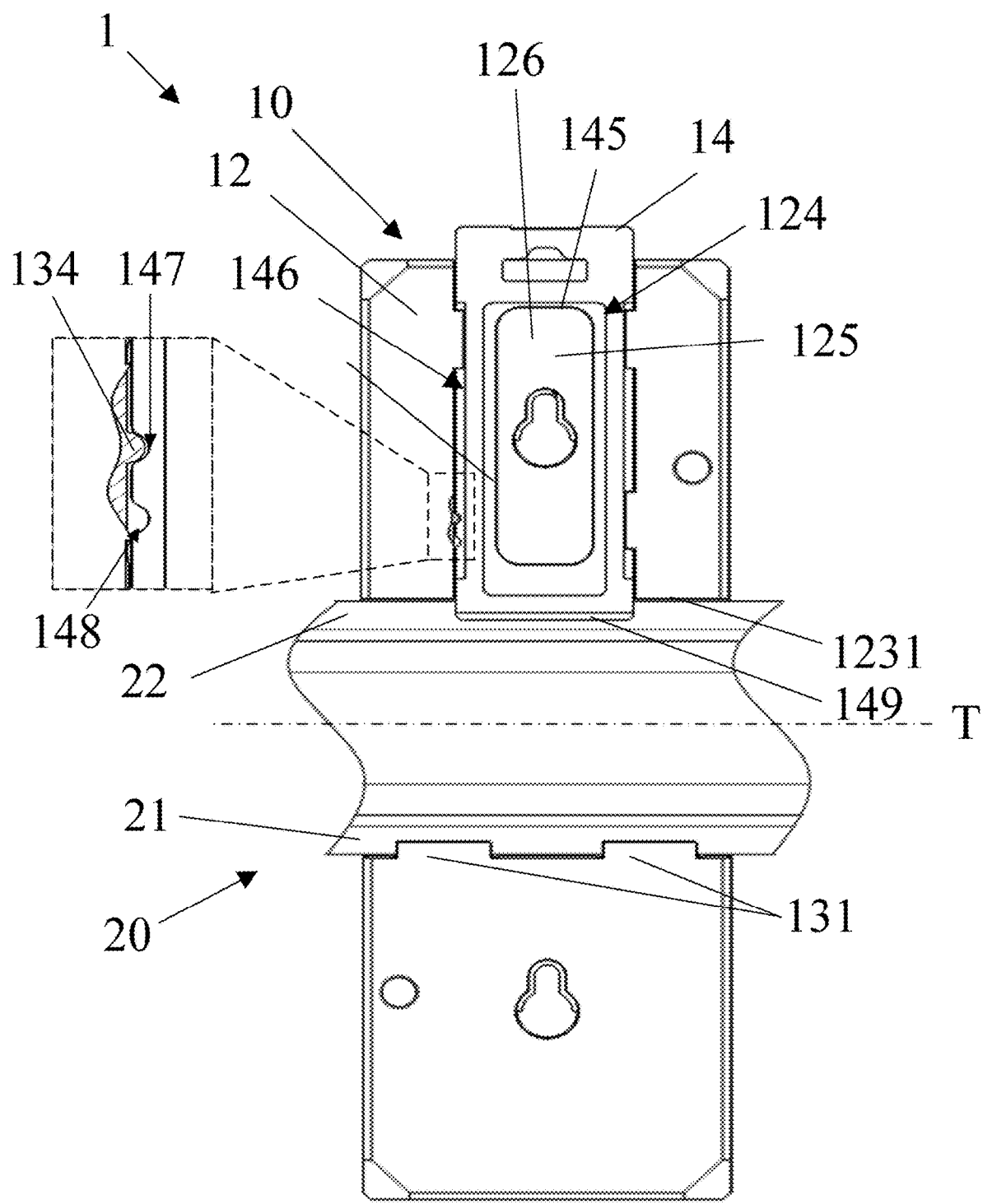
FIG. 6 shows a housing connecting with a rod as a holding member is positioned at a closed position, in accordance with one embodiment.

FIG. 5 shows the housing 10 connecting with the rod 20 as the holding member 14 is positioned at the open position, in accordance with one embodiment. FIG. 6 shows the housing 10 connecting with the rod 20 as the holding member 14 is positioned at the closed position, in accordance with one embodiment. In one embodiment, a method for connecting the housing 10 to the rod 20 in an electronic device 1 is described.

In the method, to connect the housing 10 to the rod 20, the holding member 14 is firstly placed into the second groove 124. Since the holding member 14 is made of plastic material, the holding member 14 is deformed and passes through passages formed between the blocks 133 and 135 and the stage 125. After the insertion of the holding member 14 into the second groove 124, the stage 125 is surrounded by the holding member 14. In addition, the blocks 133 and 135 are slidably positioned in the sliding groove 146, and the holding member 14 is clamped between the blocks 133 and 135 and the bottom surface 1240 of the second groove 124. As a result, the perpendicular movement of the holding member 14 (relative to the lateral panel 120) is limited by the blocks 133 and 135.

After the placement of the holding member 14 into the second groove 124, the holding member 14 may be positioned at the open position by engaging the retention structure 134 with the second recess 148. In the cases where the retention structures 134 are omitted, the holding member 14 may be fixed by a tightness of fitting between the blocks 133 and 135 and the bottom surface 1240 of the second groove 124 so that the holding member 14 can be fixed at the open position. In the open position, the holding part 149 (i.e., the lower end of the holding member 14) is flush with the upper side wall 1231 of the first groove 123 and is located out the first groove 123. Alternatively, in the open position, the holding part 149 is distant from the upper side wall 1231 of the first groove 123 and is located out of the first groove 123.

Figure 7:
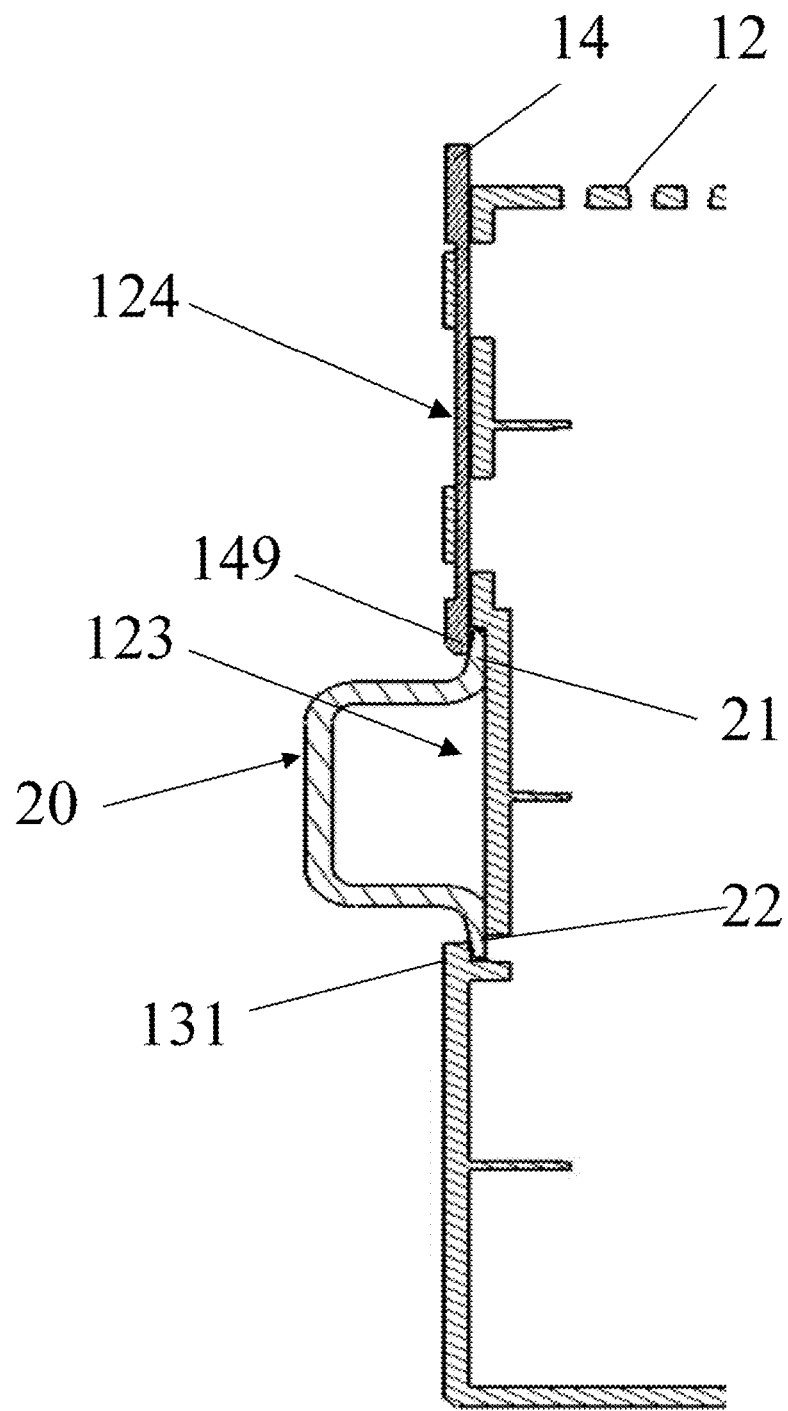
FIG. 7 shows a cross-sectional view of the housing shown in FIG. 6.

Afterwards, the rod 20 is placed into the first groove 123. At this time, the first rim 21 of the rod 20 is clamped by the hooking structure 131 and a bottom surface 1230 of the first groove 123. Afterwards, the holding member 14 is moved along the arrow indicated in FIG. 5 toward the traversal line T to the closed position as shown in FIG. 6 where the holding part 149 of the holding member is moved into the first groove 123. The holding member 14 may be fixed at the closed position via the engagement of the retention structure 134 and the first recess 147. In addition, in the closed position, as shown in FIG. 7, the second rim 22 of the rod 20 is clamped by the holding part 149 and the bottom surface 1230 of the first groove 123. As a result, the main body 12 can be quickly fixed in a very stable manner on the rod 20 without the use of additional fastening elements.

It should be noted that, since the holding part 149 has a strip shape and has a width that is substantially equal to a width of the second groove 124, the contacting area between the holding member 14 and the second rim 22 of the rod 20 is maximized and stability of the housing 10 attaching to the rod 20 is thus improved. Moreover, since the sliding groove 146 extends in same direction as the movement of the holding member 14, the amount of external force needing to be applied on the blocks 133 and 135 is minimized, so that damage to the blocks 133 and 135 can be prevented.

Referring to FIG. 6, in one embodiment, when the holding member 14 is located at the closed position, the inner edge 145 of the holding member 14 that is adjacent to the first edge 121 is abutting against the side wall of the stage 125. Therefore, the holding member 14 may be stopped at the closed position by engaging of the inner edge 145 with the stage 125.

To unload the main body 12 from the rod 20, the holding member 14 is moved away from the traversal line T to the open position (FIG. 5) in the second groove 123. Since the rod 20 is not engaged with the holding member 14, the main body 12 can be removed from the rod 20.

Figure 8:
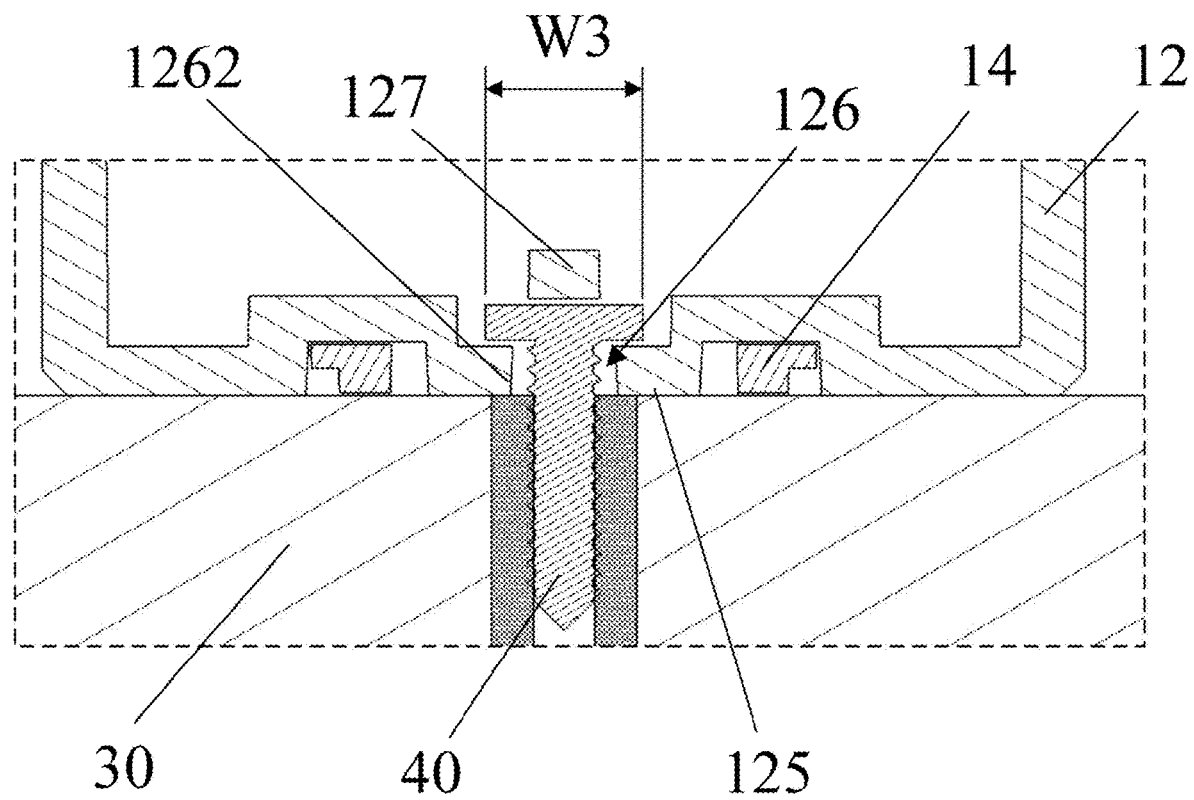
FIG. 8 shows a cross-sectional view of a housing in a horizontal direction as a housing is being mounted on a wall, in accordance with one embodiment.
Figure 9:
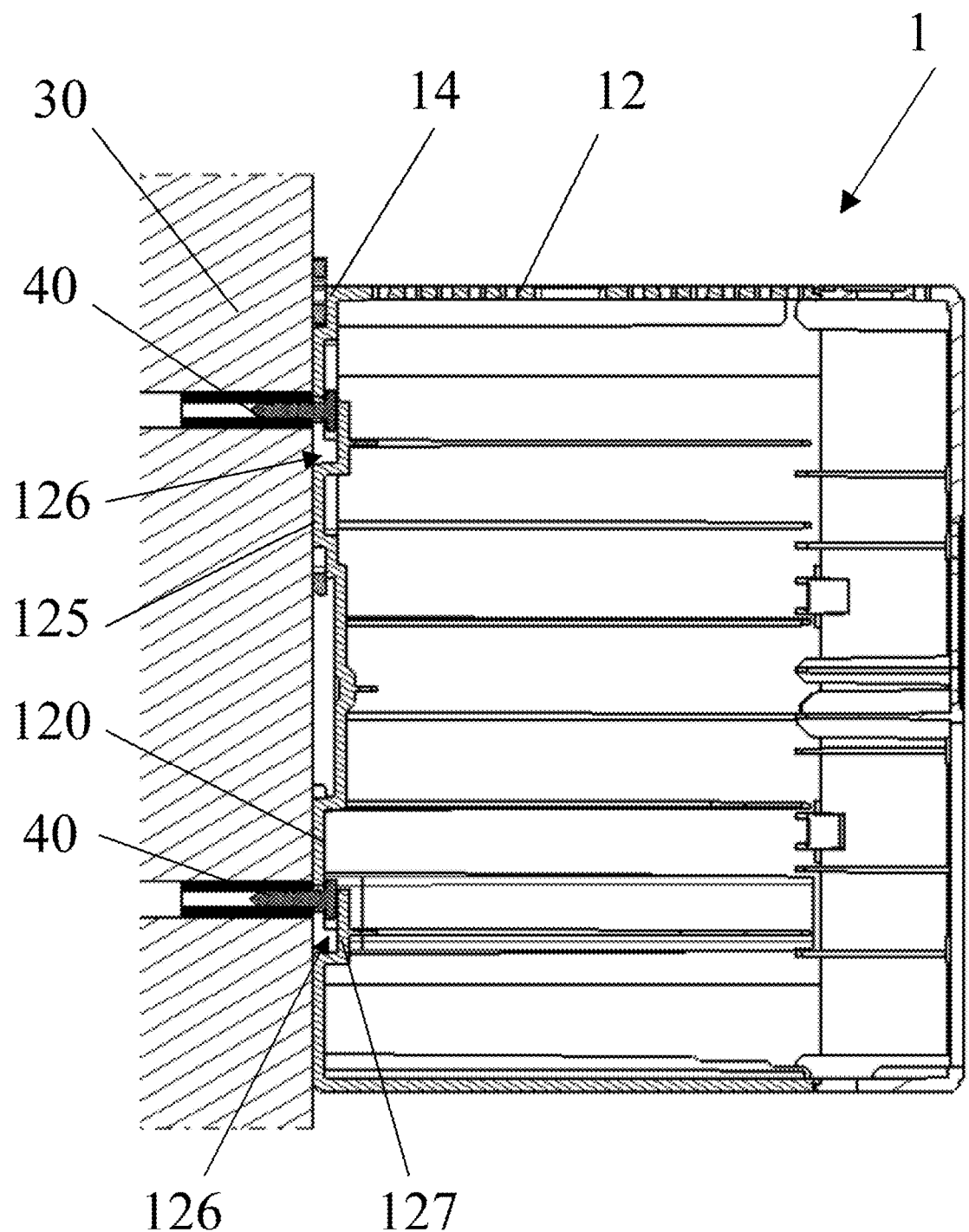
FIG. 9 shows a cross-sectional view of a housing in a vertical direction as the housing is being mounted on a wall, in accordance with one embodiment.

FIG. 8 shows a cross-sectional view of the housing 10 in a horizontal direction (parallel to the traversal line T) as the housing 10 is being mounted on the wall 30. FIG. 9 shows a cross-sectional view of the housing 10 in a vertical direction (parallel to the longitudinal line L) as the housing 10 is being mounted on the wall 30. In one embodiment, the housing 10 can be hung on the wall 30 by fastening members 40. Specifically, to mount the housing 10 on the wall 30, head portions of the two fastening members 40 (such as screws) are inserted into the first segments 1261 (FIG. 2) of the fastening holes 126. At this time, the perpendicular movement of the fastening member 40 (relative to the lateral panel 120) is limited by the disk structure 127. Afterwards, the housing 10 is moved by gravity, and the head portions of the fastening members 40 slide into the second segment 1262 of the fastening hole 126. Since the head portion of each fastening members 40 has a width W3 that is greater than the width W2 of the second segment 1262 of the fastening hole 126, the fastening members 40 are fixed on the fastening hole 126 and the housing 10 is stably hung on the wall 30.

It should be noted that since the holding member 14 has a shape of a hollow rectangle, the protruding stage 125 can be received in the central area of the holding member 14. Therefore, the fastening hole 126 on the stage 125 is located on the same plane with the other fastening hole 126. After the housing 10 is fixed on the hall 30, the surface of the lateral panel 120 and the surface of the stage 125 are firmly attached on the wall 30, and no swinging or swaying occurs.

The housing in the disclosure can be quickly mounted on a rod or hung on a wall by fastening members. By moving the holding member between the open position and the closed position, mounting the housing on the rod can be done in a relatively small space with improved work efficiency.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A housing, comprising:
a main body configured for receiving electronic components, wherein the main body comprises a lateral panel comprising a first edge, a second edge opposite to the first edge, a first groove extending along a traversal axis that extends in a central portion of the lateral panel, and a second groove extending from the first groove to the first edge along a longitudinal axis that passes through the first edge, the traversal axis and the second edge, wherein a depth of the first groove is greater than a depth of the second groove, and the main body further comprises a hooking structure extending from a lower side wall of the first groove that is adjacent to the second edge toward the traversal axis and two blocks respectively extend from two side walls of the second groove toward the longitudinal axis; and
a holding member movably disposed in the second groove and selectively positioned in a closed position, two side edges of the holding member respectively engaging with the two blocks, and a holding part of the holding member being located within the first groove.

2. The housing of claim 1, wherein the holder member is moved from the closed position to an open position when the holding member is moved away from the traversal axis, wherein in the open position, the two side edges of the holding member respectively engage with the two blocks, and the holding part of the holding member is moved out of the first groove.

3. The housing of claim 1, further comprising a retention structure, wherein at least one of the two side edges of the holding member defines a first recess, when the holding member is in the closed position, the retention structure is located in the first recess.

4. The housing of claim 3, wherein the least one of the two side edges of the holding member defines a second recess, and the second recess is adjacent to the first recess and located closer to the holding part than the first recess;
wherein, in the open position, the retention structure is located in the second recess.

5. The housing of claim 1, wherein the lateral panel further comprises a stage located in the second groove, the holding member has a rectangular ring-shape structure, and the stage is surrounded by the holding member;
wherein a distance between each of the blocks and the stage is less than a width of a portion of the holding member that is adjacent to a corresponding one of the blocks, and the holding member is made of plastic material.

6. The housing of claim 5, wherein when the holding member is in the closed position, an inner edge of the holding member engages with a side wall of the stage that is adjacent to the first edge.

7. The housing of claim 1, wherein the lateral panel further comprises two fastening holes, and the two fastening holes are located at two sides of the traversal line, respectively.

8. The housing of claim 7, wherein the lateral panel further comprises a stage located in the second groove, and the holding member has a shape of a hollow rectangle, the stage is surrounded by the holding member;
wherein one of the two fastening holes is located on the stage and the two fastening holes are located at the same plane.

9. The housing of claim 1, wherein the holding member further comprises two sliding grooves respectively located at two sides of the longitudinal axis and adjacent to the two side edges of the holding member;
wherein the two blocks are respectively located within the two sliding grooves.

10. An electronic device, comprising:
a main body configured for receiving electronic components, wherein the main body comprises a lateral panel comprising a first edge, a second edge opposite to the first edge, a first groove extending along a traversal axis that extends in a central portion of the lateral panel, and a second groove extending from the first groove to the first edge along a longitudinal axis that passes through the first edge, the traversal axis and the second edge, wherein a depth of the first groove is greater than a depth of the second groove, and the main body further comprises a hooking structure extending from a lower side wall of the first groove that is adjacent to the second edge toward the traversal axis and two blocks respectively extend from two side walls of the second groove toward the longitudinal axis;

a holding member movably disposed in the second groove and selectively positioned in a closed position where two side edges of the holding member respectively engages with the two blocks and a holding part of the holding member is located within the first groove; and
a rod comprising a first rim and a second rim respectively located at two opposite sides of the rod, wherein when the rod is received in the first groove, the first rim is located between the hooking and a bottom surface of the first groove, and the second rim is located between the holding part and the bottom surface of the first groove.

11. The housing of claim 10, wherein the holder member is moved from the closed position to an open position when the holding member is moved away the traversal line, wherein in the open position, the two side edges of the holding member respectively engage with the two blocks, and the holding part of the holding member is moved out of the first groove.

12. The housing of claim 10, further comprising a retention structure, wherein at least one of the two side edges of the holding member defines a first recess, when the holding member is in the closed position, the retention structure is located in the first recess.

13. The housing of claim 12, wherein the least one of the two side edges of the holding member defines a second recess, and the second recess is adjacent to the first recess and located closer to the holding part than the first recess;
wherein, in the open position, the retention structure is located in the second recess.

14. The housing of claim 10, wherein the lateral panel further comprises a stage located in the second groove, the holding member has a shape of a hollow rectangle, and the stage is surrounded by the holding member;
wherein a distance between each of the blocks and the stage is less than a width of a portion of the holding member that is adjacent to a corresponding one of the blocks, and the holding member is made of plastic material.

15. The housing of claim 14, wherein when the holding member is in the closed position, an inner edge of the holding member engages with a side wall of the stage that is adjacent to the first edge.

16. The housing of claim 10, wherein the lateral panel further comprises two fastening holes, and the two fastening holes are respectively located at two sides of the traversal line.

17. The housing of claim 16, wherein the lateral panel further comprises a stage located in the second groove, and the holding member has a rectangular ring-shape structure, the stage is surrounded by the holding member;
wherein one of the two fastening holes is located on the stage and the two fastening holes are located on the same plane.

18. The housing of claim 10, wherein the holding member further comprises two sliding grooves respectively located at two sides of the longitudinal axis and adjacent to the two side edges of the holding member;
wherein the two blocks are respectively located within the two sliding grooves.

* * * * *